United States Patent
Matsuura et al.

(10) Patent No.: US 7,649,159 B2
(45) Date of Patent: Jan. 19, 2010

(54) APPARATUS AND A METHOD OF SOLDERING A PART TO A BOARD

(75) Inventors: Masanari Matsuura, Chiryu (JP);
Masahiro Koizumi, Kumamoto (JP);
Masaya Tsuruta, Kumamoto (JP);
Tomoyuki Kubota, Yatsushiro (JP);
Yoshiyuki Nakamura, Fussa (JP)

(73) Assignees: Toyota Jidosha Kabushiki Kaisha, Toyota-shi (JP); Hirata Corporation, Shinagawa-ku (JP); Nihon Den-Netsu Keiki Co., Ltd., Ota-ku (JP)

( * ) Notice: Subject to any disclaimer, the term of this patent is extended or adjusted under 35 U.S.C. 154(b) by 409 days.

(21) Appl. No.: 11/486,084

(22) Filed: Jul. 14, 2006

(65) Prior Publication Data
US 2007/0023486 A1    Feb. 1, 2007

(30) Foreign Application Priority Data
Jul. 29, 2005    (JP) .............................. 2005-220746

(51) Int. Cl.
*H05B 6/10* (2006.01)
*H05B 6/12* (2006.01)
*B23K 1/002* (2006.01)

(52) U.S. Cl. ......................... 219/616; 219/615; 219/635

(58) Field of Classification Search ................. 219/616, 219/615, 617, 603, 653–656, 672–676, 647, 219/649
See application file for complete search history.

(56) References Cited

U.S. PATENT DOCUMENTS
2,452,197 A * 10/1948 Kennedy .................... 219/660

(Continued)

FOREIGN PATENT DOCUMENTS
JP    07-171677    7/1995

(Continued)

OTHER PUBLICATIONS

German Language Version of German Office Action, Appln. No. 10 2006 033 448.5-34 dated May 29, 2007.

(Continued)

*Primary Examiner*—Quang T Van
(74) *Attorney, Agent, or Firm*—Kenyon & Kenyon LLP

(57) ABSTRACT

The present invention provides technology that uniformly heats and melts a plurality of solder material arranged in a plurality of locations on a board, and uniformly solders a plurality of parts to the board that are arranged in a plurality of locations on the board. A soldering apparatus includes an induction coil having a length in the longitudinal direction that is longer than the length of the board. An inner space having a size sufficient to arrange the board therein is maintained inside the induction coil. The board supporting the parts and the solder material will be positioned in the approximate center of the inner space of the induction coil. An alternating current will flow through the induction coil in this state. An alternating magnetic field will be generated in the inner space of the induction coil. Magnetic fluxes will substantially uniformly pass through the inner space of the induction coil along the longitudinal direction of the induction coil. In this way, the plurality of solder material arranged on a plurality of locations on the board may be uniformly heated and melted. The plurality of parts arranged on a plurality of locations on the board may be uniformly soldered to the board because the plurality of solder material may be uniformly heated and melted due to magnetic fluxes that uniformly passing through the board.

10 Claims, 6 Drawing Sheets

U.S. PATENT DOCUMENTS

| | | | | |
|---|---|---|---|---|
| 3,005,893 A | * | 10/1961 | Dixon et al. | 219/615 |
| 3,694,609 A | * | 9/1972 | Kennedy | 219/633 |
| 4,622,445 A | * | 11/1986 | Matsen | 219/615 |
| 4,983,804 A | * | 1/1991 | Chan et al. | 219/616 |
| 5,093,545 A | | 3/1992 | McGaffigan | |
| 2003/0222124 A1 | | 12/2003 | Chung et al. | |

FOREIGN PATENT DOCUMENTS

| | | | |
|---|---|---|---|
| JP | 08-046353 | | 2/1996 |
| JP | 09-069682 | | 3/1997 |
| JP | 09-283915 | | 10/1997 |
| JP | 9260010 | | 10/1997 |
| JP | 2001-044616 | | 2/2001 |
| JP | 2001-53434 | * | 2/2001 |
| JP | 2001-257458 | | 9/2001 |
| JP | 2002-076604 | | 3/2002 |

OTHER PUBLICATIONS

German Translation of German Office Action, Appln. No. 10 2006 033 448.5-34 dated May 29, 2007.

English Translation of German Office Action, Appln. No. 10 2006 033 448.5-34 dated May 29, 2007.

German Office Action, Application No. 10 2006 062 841.1-34, dated Jun. 30, 2009 (references cited previously).

Translation of German Office Action, Application No. 10 2006 062 841.1-34, dated Jun. 30, 2009 (references cited previously).

* cited by examiner

APPARATUS AND A METHOD OF SOLDERING A PART TO A BOARD

CROSS REFERENCE TO RELATED APPLICATION

This application claims priority to Japanese Patent Application No. 2005-220746 filed on Jul. 29, 2005, the contents of which are hereby incorporated by reference into the present application.

BACKGROUND OF THE INVENTION

1. Field of the Invention

The present invention relates to an apparatus and a method of soldering parts such as electronic parts to a board such as a circuit board.

2. Description of the Related Art

Technology for manufacturing an electronic device by soldering electronic parts to a board on the surface of which circuit patterns are formed is known. In this situation, the solder material is employed in order to mechanically fix the electronic parts to the board, and ensure electrical conduction between the circuit patterns formed on the surface of the board and the electronic parts. The solder material is very useful in order to ensure electrical conduction while mechanically fixing the electronic parts to the board, but is also sometimes employed only for mechanically fixing electronic parts to a board. For example, electronic parts may be soldered to a board even if there is no need to ensure electrical conduction via the solder material because wirings that electrically connect the electronic parts and the board are provided separately from the solder material. Electronic parts are also sometimes soldered to a board in order to transfer heat generated by electronic parts to the board during operation of the electronic parts.

The present invention relates to technology for soldering and fixing a part to a board. The present invention may be applicable in the case where circuit patterns are formed on a board to make electrical conduction between the parts and the board via solder material, and also in the case where circuit patterns are not formed. The present invention may be applicable in the case of soldering electronic parts to a board and also in the case of soldering mechanical parts to a board.

In order to solder a part to a board, technology has been developed in which solder material in the solid state is placed between the board and the part, the induction heating phenomenon is used to heat and melt the solder material, and the part is soldered to the board with the melted solder material. The induction heating phenomenon is a phenomenon that generates an alternating magnetic field by conducting an alternating current through an induction coil, generates an alternating current in a magnetic resistor that is placed inside the alternating magnetic field, and thus, generates heat in the magnetic resistor by means of the alternating current generated in the magnetic resistor. Many types of solder material have characteristics as magnetic resistors, and will generate heat when placed in an alternating magnetic field. In the alternative, the magnetic resistor may be placed in a position adjacent to the solder material, and heat generated in the magnetic resistor may be transmitted to the solder material.

Japan Patent Application Publication H09-283915 discloses a device that uses the induction heating phenomenon to perform soldering. In this soldering apparatus, an induction coil is placed below the board, and a ferrous board is used. When solder material in the solid state is placed on the surface of the ferrous board, and an alternating current is conducted through the induction coil with a part placed on the surface of the solder material, the ferrous board will be heated, the heat will be transmitted to the solder material and melt the solder material, and the part will be soldered to the board.

Japan Patent Application Publication H07-171677 discloses technology in which a flat induction coil is placed above a board that supports a part via solder material, and the solder material placed on the board is heated and melted by an alternating magnetic field generated by the induction coil.

BRIEF SUMMARY OF THE INVENTION

When a soldering apparatus is used, the solder material and the parts may be arranged in various positions on the board, in accordance with the product type to be manufactured. In the alternative, it may be efficient to heat and melt a plurality of solder material distributed to a plurality of positions on the board at one time.

In order to heat and melt the solder material and solder a part to the board, the solder material must be controlled at an appropriate temperature during soldering. When the temperature is too high, the circuit parts may overheat, and the capabilities thereof may be degraded. When the temperature is too low, the solder material may not melt, and a part may not be fixed to the board. It is very important to heat the solder material to an appropriate temperature, regardless of the position of the solder material placed on the board.

Magnetic flux generated by an induction coil circulates between the N pole and the S pole of the induction coil. Magnetic flux that extends from the N pole to the outside of the induction coil will converge at the S pole after extending over the periphery of the induction coil. The magnetic flux density will change significantly on the outside of the induction coil, depending on the location thereof.

In the technology disclosed in Japan Patent Application Publication No. H09-283915, the induction coil is arranged below the board. In the technology disclosed in Japan Patent Application Publication No. H07-171677, the induction coil is arranged above the board. With either technology, magnetic flux that extends on the outside of the induction coil is used for heating and melting solder material. With a configuration, in which a board and solder material are arranged on the outside of an induction coil, as in the conventional technology, there will be large variations in the temperature to which the solder material is heated, depending upon the positions of the solder material placed on the board. When the solder material is placed in a location in which the magnetic flux density is high, the solder material may overheat. When the solder material is placed in a location, in which the magnetic flux density is low, the solder material may be heated to an insufficient temperature. With conventional soldering apparatus, it may be difficult to uniformly heat a plurality of solder material arranged in a plurality of locations on a board. In addition, it may be difficult to satisfactorily solder a plurality of types of devices in which the solder material is arranged in different positions on the board.

An object of the present invention is to provide technology that can uniformly heat a plurality of solder material arranged in a plurality of locations on a board, and uniformly solder a plurality of parts arranged in a plurality of locations on the board.

Another object of the present invention is to provide technology that can satisfactorily solder a plurality of types of devices in which the solder material is arranged in a plurality of locations on the board.

The magnetic flux density, inside an induction coil, is more uniform than the outside of an induction coil. The range of variation of the magnetic flux density will be small depending on the location.

In the present invention, a board, solder material, and parts are positioned inside an induction coil in which the distribution of the magnetic flux density is maintained so as to be relatively uniform other than outside of the induction coil. When an alternating current is conducted through the induction coil in this state, a uniform magnetic flux can be passed through the board and the solder material. When an alternating current is conducted through the induction coil when a board, solder material, and parts are arranged inside the induction coil, the plurality of solder material arranged in a plurality of positions on the board can be uniformly heated. As a result, the plurality of parts arranged in a plurality of locations on the board can be uniformly soldered to the board. Alternatively, the parts can be satisfactorily soldered to the board, even if a plurality of solder material is distributed to a plurality of locations on the board.

The soldering apparatus of the present invention uses the induction heating phenomenon, to melt solder material and solder at least one part to a board.

An apparatus of the present invention comprises an induction coil, a positioning device, and a controller. The induction coil is longer than the length of the board along the longitudinal direction of the induction coil and has an inner space penetrating the induction coil along the longitudinal direction. The positioning device positions the board supporting the part via a solder material at an approximate central region of the inner space within a cross sectional plane of the induction coil. The controller applies alternating current to the induction coil.

When alternating current is applied to the induction coil, the solder material is heated and melted by the effect of induction heating caused by an alternating magnetic field, and thus, the part is soldered to the board.

The induction coil need not be a single induction coil. A plurality of induction coils may be adjacently arranged in the longitudinal direction. When a plurality of induction coils is employed, the total length of the plurality of induction coils may be longer than the board.

When an alternating current flows through the induction coil, an alternating magnetic field that extends in the longitudinal direction of the induction coil will be generated inside the induction coil. The magnetic flux density produced inside the induction coil will be uniform, and the range of variation of the magnetic flux density will be small depending on the location inside the induction coil. In particular, the magnetic flux density will be very uniform in the central region of the cross-section of the inner space of the induction coil. The length of the induction coil is formed to be longer than the length of the board, thus the direction of the magnetic flux will be substantially parallel with the plane of the board when the board is arranged inside the induction coil. When a board is arranged in the central region of the cross-section of a coil inner space that is longer than the board and an alternating magnetic field is generated therein, a plurality of solder material arranged in a plurality of locations on the board can be uniformly heated. A plurality of parts arranged in a plurality of locations on the board can be uniformly soldered to the board.

The soldering apparatus described above also provides the following effects. All of the magnetic flux that is generated by the induction coil will pass through the interior of the induction coil. Thus, the magnetic flux density generated by the induction coil will be higher inside the induction coil than outside the induction coil. In particular, the magnetic flux density will be high in the central region of the cross-section of the coil inner space. By positioning a board inside an induction coil in which the magnetic flux density is high (with the magnetic flux density being particular high in the central region of the cross-section thereof), solder material on the board may be heated with good efficiency. A heating efficiency can be obtained that is higher than when a board is positioned on the outside of an induction coil, as with the conventional technology.

The present invention also provides a method of manufacturing a device having a board on which at least one part is soldered. The method comprises a step of positioning the board that supports the part via a solder material at an approximate central region of an inner space of an induction coil within a cross sectional plane of the induction coil, and a step of applying an alternating current to the induction coil. When alternating current is applied to the induction coil, the solder material is heated and melted due to an alternating magnetic field and the part is soldered to the board.

According to the above method, a device in which all of a plurality of parts is satisfactorily soldered to a board can be manufactured.

According to the present invention, a plurality of solder material distributed to a plurality of locations on a board can be uniformly heated and melted. All of the plurality of parts distributed to the plurality of locations on the board can be satisfactorily soldered to the board. In addition, all parts can be satisfactorily soldered to a board of any one of a plurality of types of devices, in which the positions of the solder material on the board differ depending on the type of device.

DETAILED DESCRIPTION OF THE INVENTION

Figure 1:
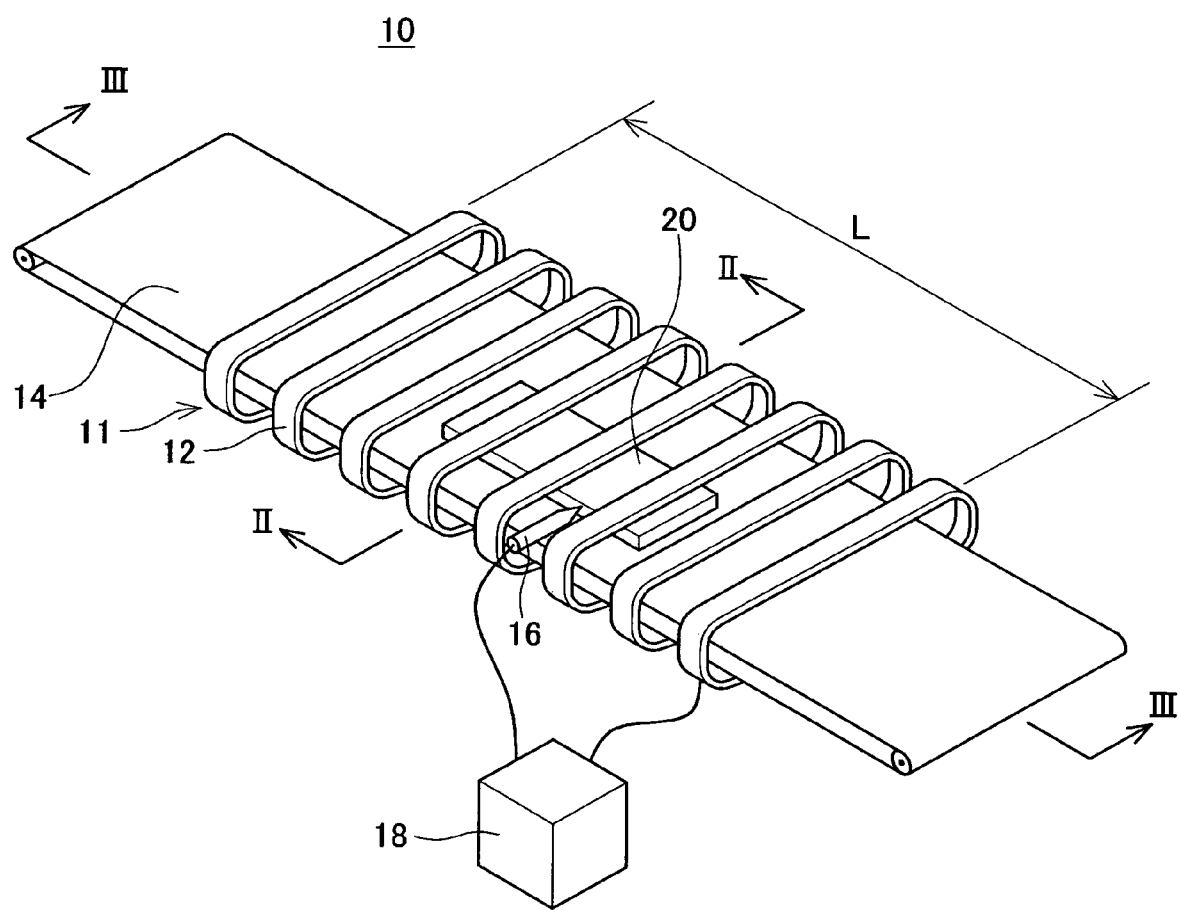
FIG. 1 is an overall view of a soldering machine in an embodiment.

The preferred technical characteristics of the present invention will be described below.

The pitches of the winding of the induction coil may vary along the longitudinal direction of the induction coil.

When a plurality of parts are to be soldered in a plurality of locations on a board, the type or size of the solder material to be employed may differ according to their positions on the board. Proper heating conditions may differ according to the type or size of the solder material. In other words, there may be times in which a plurality of types of solder material required different heating conditions will be employed on one board.

By arranging the pitches of the winding in the longitudinal direction of the induction coil so that some of the pitches are further apart and some are close together, the magnetic flux density in the inner space of the induction coil may be varied in the longitudinal direction. The magnetic flux density may be lowered in the pitches of the winding that are further apart from each other, and the magnetic flux density may be heightened in the pitches of the winding that are close together.

If the pitches of the winding are close together in the portions thereof in which solder material that must be strongly heated are arranged, and the pitches of the winding are further apart in the portions thereof in which solder material that must be weakly heated are arranged, the solder material that must be strongly heated may be strongly heated at the same time as the solder material that must be weakly heated may be weakly heated.

The cross sectional areas of the induction coil may vary along the longitudinal direction.

In this situation as well, the magnetic flux density in the inner space of the induction coil may be varied in the longitudinal direction of the induction coil. The magnetic flux density may be lowered in large portions of the cross-sectional area, and the magnetic flux density may be heightened in small portions of the cross-sectional area.

When the technology described above is applied, the magnetic flux density may be heightened in positions in which solder material that must be strongly heated is arranged, and the magnetic flux density may be lowered in positions in which solder material that must be weakly heated is arranged. When a plurality of solder material requiring different heating conditions is arranged on a board, each solder material may be heated and melted in accordance with each requirement thereof. If a plurality of solder material requiring different heating conditions is employed to solder a plurality of parts, all of the parts may be satisfactorily soldered at one time.

The positioning device may convey the board from outside of the induction coil into the inner space of the induction coil.

In this situation, solder material and parts may be positioned in appropriate positions on the board outside of the induction coil, and the board on which the parts are positioned thereon via the solder material may be conveyed to the central region of the coil inner space.

The cross sectional areas of the induction coil may gradually decrease from upstream to downstream along the conveying direction of the positioning device.

Here, "gradually decrease" includes situations in which the cross-sectional area of the inner space of the induction coil will decrease step-wise along the direction in which a board is conveyed. The conveying direction is substantially same as the longitudinal direction of the induction coil.

According to the configuration described above, magnetic flux of low density will flow through the board when the board is conveyed to a location in which the cross-sectional area is large. The board may be heated to a lower temperature. Then, when conveyance continues and the board proceeds to a location in which the cross-sectional area is smaller, magnetic flux of a density that is higher than in the location where the cross-sectional area is large will flow through the board. The board may be heated to a higher temperature. The board may be gradually heated. The heating conditions may be set in accordance with the size of the cross-sectional area of the induction coil. According to the present device, it will no longer be necessary to control the size of the current that flows through the induction coil in order to gradually heat a board. Note that it is preferable that an alternating current may be applied to the induction coil while the conveyance of a board is being temporarily stopped at each position of the induction coil in which the cross-sectional area thereof differs.

It is preferred that the positioning device positions the board to which a heat generator is mounted. In this case, the heat generator generates heat due to an alternating magnetic field caused by alternating current applied to the induction coil. The "heat generator" is preferably formed with a ferromagnetic material, and a conductor having an appropriate degree of magnetic resistance. The "heat generator" may be referred to as a susceptor.

Solder material having weak magnetism may sometimes be used. In order to heat a solder material having weak magnetism by means of the inductive heating phenomenon, a high power alternating magnetic field will be needed. If a heat generator is used that efficiently generates heat by means of an alternating magnetic field, the strength of the alternating magnetic field needed to heat the solder material may be reduced. If the heat generator is arranged near the solder material, the solder material may be efficiently heated by the heat generator, and the strength of the alternating magnetic field needed to melt the solder material may be reduced. Therefore, the alternating current applied to the induction coil by the controller may be reduced.

In the case where the heat generator is employed, the thickness of the heat generator along a direction perpendicular to a contact surface between the heat generator and the board may vary in an area of the contact surface.

The appropriate amount of time (heating time) needed to raise the temperature to the melting temperature (the appropriate heating time) will sometimes differ depending on the type of solder material employed. When a plurality of solder material having different proper heating times is arranged on the same board, the thickness of the heat generator may be thick in locations in which solder material having long proper heating times are arranged, and thickness of the heat generator may be thin in locations in which solder material having short proper heating times are arranged.

The heat generator may change the heating time in accordance with the size of the cross-sectional area, even when the density of the magnetic flux that passes through is the same. A long period of time may be needed for heating the heat generator in portions having a large cross-sectional area, and a short period of time may be needed for heating the heat generator in portions having a small cross-sectional area. By adjusting the thickness of the heat generator in order to match the proper heating time of the solder material, a proper heating time suitable for each solder material may be achieved. All of the parts can be uniformly and satisfactorily soldered at one time even if the solder material employed on the board have different proper heating time.

The surface area of the heat generator at a contact surface with the board may be smaller than the surface area of the board at a contact surface with the heat generator.

In other words, it is preferable that the heat generator does not uniformly contact with the board, but rather have a portion that contacts the board and a portion that does not contact the board.

There may be locations on the board in which the parts are clustered together, and other locations thereon in which this is not the case. The solder material may also be unevenly distributed in accordance with the density in which the parts are arranged on the board. The board should not be heated in locations in which solder material is not arranged. If the heating locations on the board may be reduced, an increase in the temperature of the entire board may be inhibited. The heat generator preferably does not contact the board in locations which have no need to be heated. In other words, the surface area of the heat generator mounted on the board is preferably formed to be smaller than the surface area of the board mounted on the heat generator. In this way, heating of the board at unnecessary locations thereon may be prevented.

In a method of manufacturing a device according to the present invention, a process is preferably performed that mounts the heat generator to the board prior to the process of positioning the board within the inner space of the induction coil.

According to this method, the heat generator can efficiently heat the board inside the induction coil. A device having parts that are satisfactorily soldered to the board may be manufactured with less electric power than when solder material is directly heated by means of the induction heating phenomenon.

Magnetic material is preferably included in the solder material. If magnetic material is included in the solder material, the solder material can be directly heated by an alternating magnetic field.

The heat generator is preferably formed such that a material containing a ferromagnetic material is embedded in a non-magnetic frame. By distributing the ferromagnetic material in the frame and mounting the frame to the board, the ferromagnetic material are easily arranged close to portions of the board where should be heated, while avoiding to arrange the ferromagnetic material to portions of the board where should not be heated.

Embodiment 1

Preferable embodiments will described below with referring drawings.

FIG. 1 shows first embodiment of the soldering machine 10 according to the present invention. The soldering machine 10 comprises a conveyor 14 (corresponding to a positioning device recited in claims) that conveys a board supporting circuit parts via solder material in a solid state, an induction coil 11 that surrounds the middle of the conveyor 14, a temperature sensor 16 that measures the temperature of the board, and a controller 18 that controls those units. The controller 18 applies alternating current to the induction coil 11. The induction coil 11 is formed by winding a winding 12 into a helical shape.

Hereinafter, a board that includes a circuit part and solder material will be referred to as work piece 20. The circuit part, solder material, and board are not individually illustrated in FIG. 1 but illustrated in FIG. 2. The induction coil 11 is drawn in FIG. 1 as it is formed by winding a wide wire 12 (a winding) a small number of times in order to make it easy to understand. In fact, the induction coil 11 is formed by winding a wire that is thinner than shown in FIG. 1 a large number of times.

As shown in FIG. 1, the length L of the induction coil 11 is formed to be longer than the length of the work piece 20. In addition, an inner space that penetrates through the induction coil 11 in the inside of the induction coil 11 is formed in a size that allows the work piece 20 to be arranged therein.

The conveyor 14 is arranged so as to penetrate the inner space of the induction coil 11. When the work piece 20 is conveyed into the inner space of the induction coil 11 by the conveyor 14, the controller 18 will cause an alternating current to flow through the induction coil 11. An alternating magnetic field will be generated by the alternating current flowing through the induction coil 11. The solder material on the work piece 20 will be heated and melted by means of the induction heating phenomenon produced by the alternating magnetic field. When the solder material is heated and melted, the controller 18 will stop the flow of the alternating current. The temperature of the heated and melted solder material will decrease, and the circuit parts and the board of the work piece 20 will adhere to each other. In other words, the circuit parts will be soldered to the board. The temperature sensor 16 will observe the temperature so that the work piece 20 does not overheat.

Figure 2:
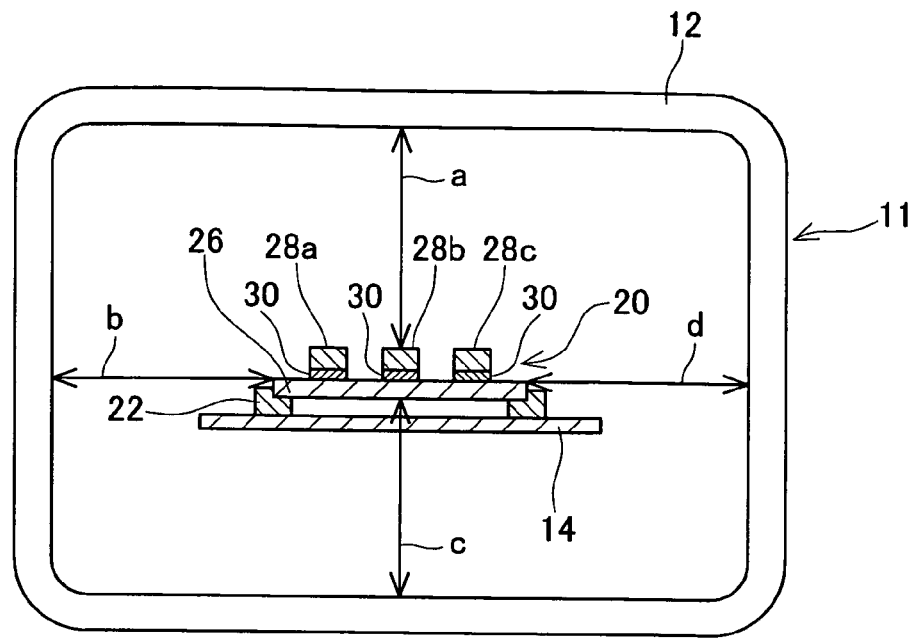
FIG. 2 is a cross-sectional view corresponding to line II-II of FIG. 1.

FIG. 2 is a cross-sectional view corresponding to line II-II of FIG. 1. The specific shape of the work piece 20 is also schematically shown in FIG. 2. A board 26 is mounted on the conveyor 14 via a pallet 22. Circuit parts 28a, 28b, 28c, such as semiconductor elements, condensers, resistors, and the like, are mounted on the board 26 via solder material 30.

The circuit parts 28a, 28b, 28c are arranged in various positions on the board 26 in accordance with the circuit configuration. The solder material 30 that solder the circuit parts 28a, 28b, 28c to the board 26 are also arranged in various positions on the board 26 in accordance with the positions in which the circuit parts are arranged.

The winding 12 of the induction coil 11 is wound into a substantially rectangular shape. The work piece 20 will be arranged substantially in the central region of the inner space of the induction coil 11 in the cross-sectional plane of the induction coil 11. The cross-sectional plane of the induction coil 11, in other words, is substantially equal to a plane parallel to a winding direction of the winding 12. As shown in FIG. 2, the work piece 20 is arranged so that left distance "b" and right distance "d" between the work piece 20 and the winding 12 are substantially to be equal. In addition, the work piece 20 is arranged so that upper distance "a" and lower distance "c" between the work piece 20 and the winding 12 are substantially to be equal. In other words, the conveyor 14 is arranged so that the work piece 20 will be arranged as described above. Thus, the work piece 20 will be arranged in the interior of the induction coil 11, and substantially in the central region of the inner space of the induction coil 11 within the lateral plane of the induction coil 11 (i.e., in a plane that is parallel to the winding direction of the winding 12). This central region of the inner space is where the magnetic flux density generated by the induction coil 11 will be substantially uniform. Thus, an alternating magnetic field will be uniformly applied to the work piece 20. As a result, the solder material 30 arranged in various positions on the board 26 of the work piece 20 may be uniformly heated and melted.

Figure 3:
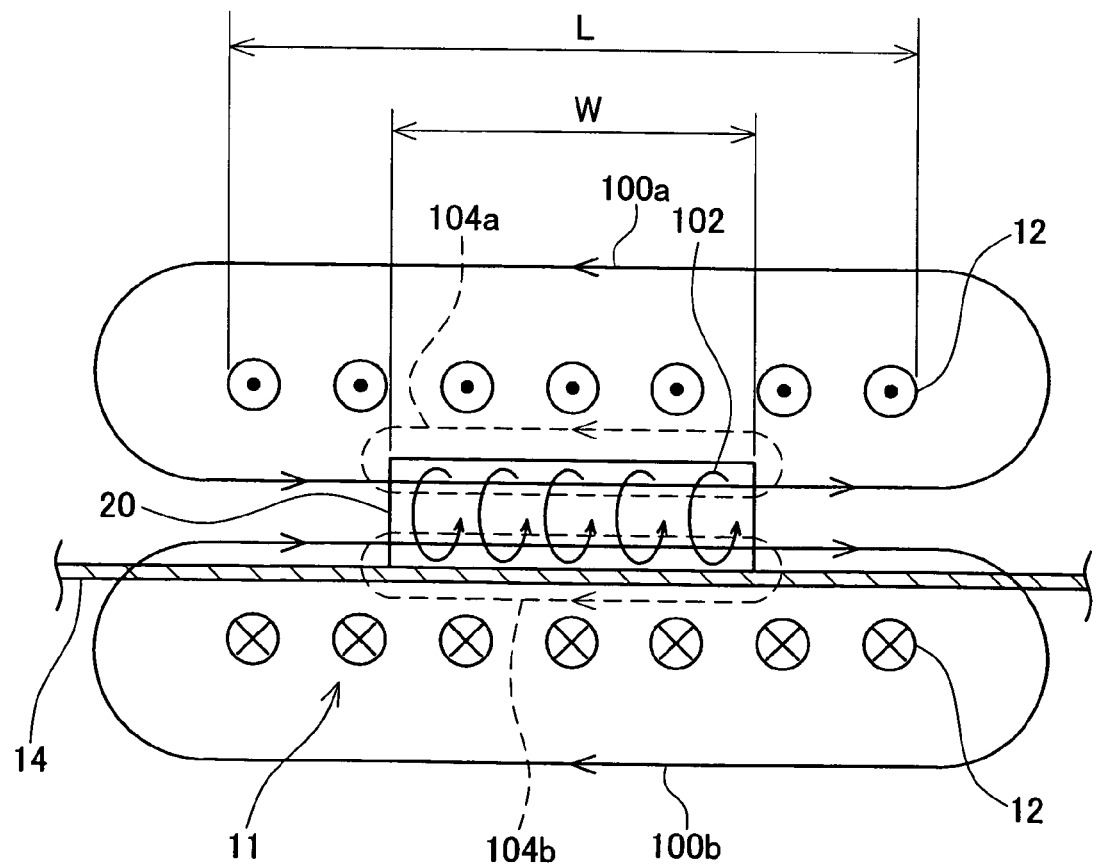
FIG. 3 is a cross-sectional view corresponding to line III-III of FIG. 1.

Next, the induction heating effect that will be uniformly generated on the work piece 20 arranged inside the induction coil 11 will described in detail. FIG. 3 is a cross-sectional view corresponding to line III-III of FIG. 1. FIG. 3 shows the work piece 20 mounted on the conveyor 14 in the inner space of the induction coil 11. The induction coil 11 shown in FIG. 3 depicts the direction in which current will flow at the moment that an alternating current is applied. Note that in order to simplify the description in FIG. 3, it will be assumed that the entire work piece 20 is a magnetic material.

At the timing shown in FIG. 3, the alternating current flows in the winding 12 of the induction coil 11 positioned in the upper portion of FIG. 3 from the rear of the drawing plane toward the front of the drawing plane. At the same time, the current flows in the winding 12 of the induction coil 11 positioned in the lower portion of FIG. 3 from the front of the drawing plane toward the rear of the drawing plane. A magnetic flux 100a that rotates counterclockwise will be generated so as to surround all of winding 12 of the induction coil 11 positioned in the upper portion of FIG. 3. A magnetic flux 100b that rotates clockwise will be generated so as to surround all of winding 12 of the induction coil 11 positioned in the lower portion of FIG. 3. The magnetic fluxes will flow from left to right in the inner space of the induction coil 11. The entire length L of the induction coil 11 is sufficiently longer than the length W of the work piece 20 along the longitudinal direction of the induction coil 11, and thus the magnetic fluxes will pass through the work piece 20 so as to be parallel with each other. When there is a change in the magnetic flux density that the induction coil 11 generates by means of an alternating magnetic field, eddy current will be generated in the work piece 20 by means of the magnetic induction effect. The eddy current will flow in a direction so that a magnetic flux generated by the eddy current will cancel out the increase or decrease in the magnetic flux density generated by the alternating current passing through the winding 12. For example, in the event that the magnetic fluxes 100a, 100b generated by the induction coil 11 are reduced, eddy current 102 will be generated in the work piece 20 as shown in FIG. 3. In this situation, a magnetic flux 104a and magnetic flux 104b will be generated inside the work piece 20 by the eddy current 102. The orientation of the magnetic fluxes 104a, 104b inside the work piece 20 is the same orientation of the magnetic fluxes 100a, 100b that are generated by the induction coil 11.

As shown in FIG. 3, parallel magnetic fluxes will pass through the work piece 20. In other words, substantially uniform magnetic fluxes will pass through the work piece 20. Because the magnetic fluxes uniformly pass through the work piece 20, the eddy current generated inside the work piece 20 will also be uniform. In the description provided above, the work piece 20 is described as a magnetic material, but in fact the eddy current will be generated in the solder material. As described above, because uniform magnetic fluxes pass through the entire work piece 20, the eddy current generated in the solder material will also be uniform. Thus, solder material arranged in various positions on a board may be uniformly heated and melted by uniformly occurring the induction heating effect. If distributed solder material may be uniformly heated and melted, circuit parts may be uniformly soldered to the board.

Furthermore, in the present embodiment, the work piece 20 will be arranged in substantially the central region within the inner space of the induction coil 11 by means of the conveyor 14, in a plane that is parallel to the winding direction of the winding 12 of the induction coil 11. The magnetic flux density will be highest in the central region of the induction coil 11. Thus, the magnetic fluxes generated by the induction coil 11 may effectively pass through the work piece 20. This will allow the solder material on the work piece 20 to be heated with good efficiency.

Note that the description provided above is limited to two dimensions, but the same description will also apply even if expanded to three dimensions.

Different types of solder material may be used, depending upon the circuit parts on the board. In other words, there may be times in which different types of solder material are employed on one board. The type of solder material to be employed will differ based on the proper temperature for melting (the proper melting temperature). The heating conditions for each solder material must be adjusted in order to match the proper melting temperature for each solder material.

In addition, depending on the arrangement of the circuit parts on the board, there may be locations thereon in which the circuit parts are clustered together, and locations thereon in which this is not the case. The solder material will also be unevenly distributed on the board in accordance with the distribution of the circuit parts. In locations where the solder material is clustered together, a large quantity of heat will be needed in order to melt all of the solder material. On the other hand, in locations in which the solder material is not clustered together, the quantity of heat must be lowered in accordance with the quantity of solder material.

Next, the structure of a soldering machine will be described below that performs heating when a plurality of solder material having different proper melting temperatures are employed on a board, and performs heating when there are locations on the board in which solder material is densely arranged and locations thereon in which solder material is loosely arranged. In order to simplify the description, it will be limited to two dimensions.

Figure 4:
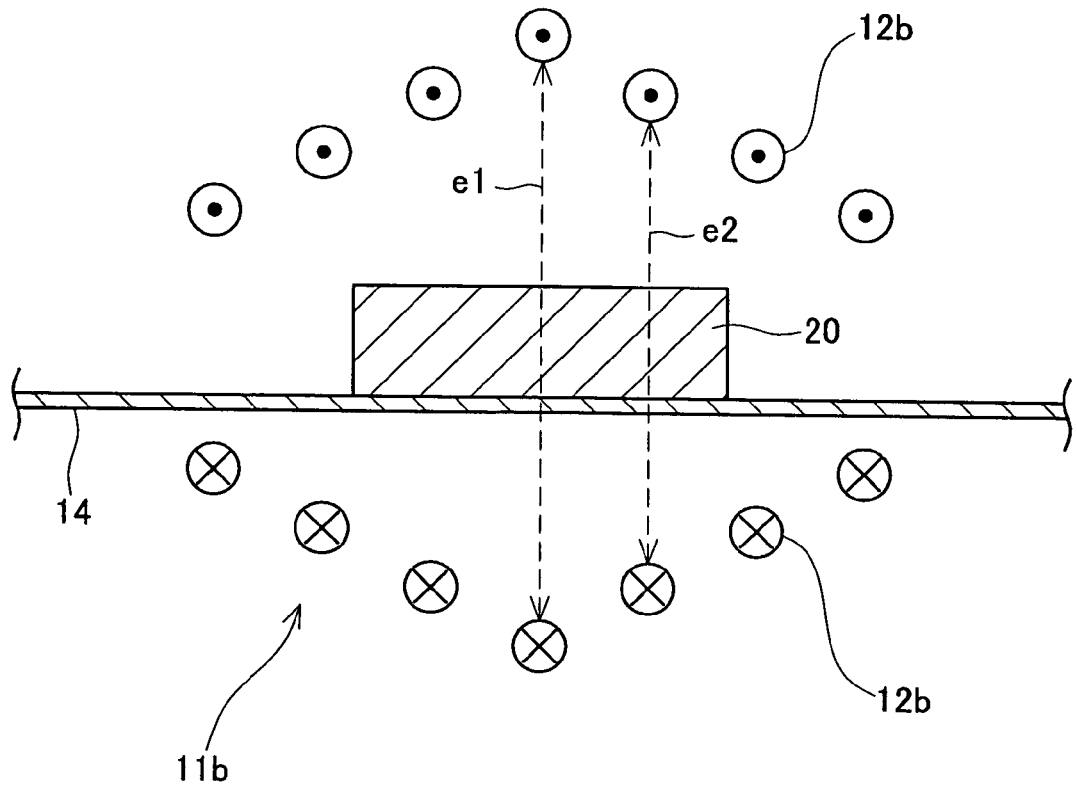
FIG. 4 shows an example of arrangement of the windings of an induction coil.

An example will be used in which solder material is densely arranged in the edge regions of the work piece 20, and solder material is loosely arranged in the central region of the work piece 20. In this case, a winding 12b of an induction coil 11b may be arranged as shown in FIG. 4. In other words, the winding 12b will be wound so that a distance "e1" between the upper and lower sides of the winding 12b in the central region of the work piece 20 where the solder material is loosely arranged is longer than a distance "e2" between the upper and lower sides of the winding 12b in the edge regions of the work piece 20 where the solder material is densely arranged. When the winding 12b is wound as described above, the magnetic flux density will be low in the portions between the upper and lower sides of the winding 12b where the distance is long (the portion shown by "e1" in FIG. 4), and the magnetic flux density will be high in the portions between the upper and lower sides of the winding 12b where the distance is short (the portion shown by "e2" in FIG. 4). In this way, the strength of the alternating magnetic field generated by the induction coil 11b may be weakened in the "e1" portion, and strengthened in the "e2" portion. Thus, the strength of the eddy current in the work piece 20 produced by a change in the alternating magnetic field may also be weakened in the "e1" portion, and strengthened in the "e2" portion. The heating may be increased in the edge regions of the work piece 20 in which solder material is clustered together, and reduced in the central region of the work piece 20 where the solder material is not clustered together. The distribution of heat applied to the work piece 20 may be adjusted to match the density distribution of the solder material arrangements on the work piece 20.

In addition, contrary to the case described above, if, for example, solder material is loosely arranged in the edge regions of the work piece 20, and solder material is densely arranged in the central region of the work piece 20, the winding 12b will be wound so that the distance "e1" between the upper and lower sides of the winding 12b in the central region of the work piece 20 where the solder material is densely arranged is shorter than the distance "e2" between the upper and lower sides of the winding 12b on the edge regions of the work piece 20 where the solder material is loosely arranged. Due to the way in which the winding 12b is wound, the quantity of heat provided to the solder material by means of the induction heating effect of the induction coil 11 may be increased in the central region of the work piece 20 where solder material is densely arranged, and may be decreased in the edge regions of the work piece 20 where solder material is loosely arranged. The distribution of heat applied to the work piece 20 may be adjusted to match the density distribution of the solder material arrangements on the work piece 20. Each solder material may be uniformly heated and melted. Thus, circuit parts may be uniformly soldered.

The configuration described above may also be adopted in the case where solder material having different proper melting temperatures are employed on one board.

The description provided above was limited to two dimensions. However, in three dimensions, the portion "e1" shown in FIG. 4 between the upper and lower sides of the winding 12b where the distance is large corresponds to enlarging the inner area of the induction coil 11b in the longitudinal direction of the induction coil 11b in a plane that is parallel to the winding direction of the winding 12b. In addition, the portion "e2" shown in FIG. 4 between the upper and lower sides of the winding 12b where the distance is short corresponds to reducing the inner area of the induction coil 11b in the longitudinal direction of the induction coil 11b in a plane that is parallel to the winding direction of the winding 12b. In other words, this corresponds to forming the induction coil 11b so that the cross-sectional areas of the inner space may change in the longitudinal direction thereof.

The same effect may also be obtained by narrowing and widening the pitches of the winding in an induction coil. More specifically, the pitches of the winding will be narrowed in the portions of the work piece 20 where solder material are clustered together, and the pitches of the winding will be widened in the portions of the work piece 20 where solder material are not clustered together. Thus, by adjusting the pitches of the winding, the quantity of heat provided to a work piece can be adjusted in accordance with the portion of the work piece.

Figure 5:
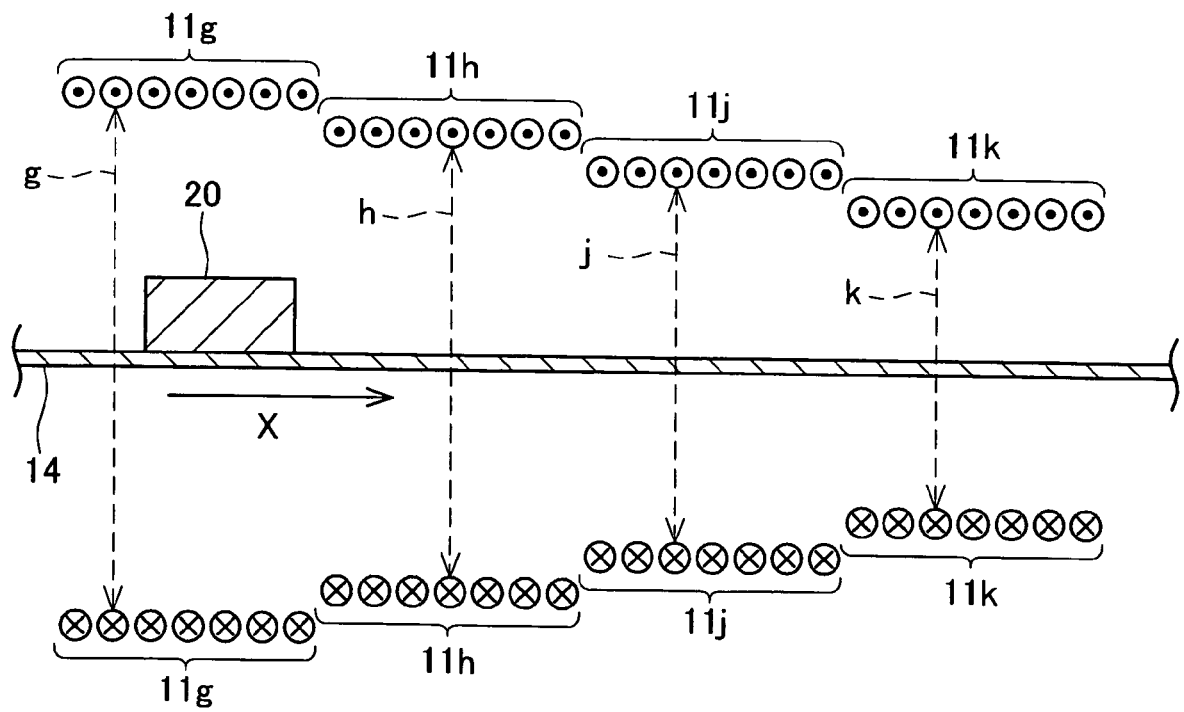
FIG. 5 shows another example of arrangement of the winding of an induction coil.

Next, FIG. 5 will be employed to describe a soldering machine that can gradually heat the solder material 30 on the work piece 20 (shown in FIG. 2). In FIG. 5 as well, the description will be limited to two dimensions in order to simplify the description.

The work piece 20 will be conveyed by the conveyer 14 in the direction indicated by x in FIG. 5, i.e., from left to right in the drawing. The induction coil 11 may be divided into four portions, 11g, 11h, 11j, and 11k. The distance between the upper side and the lower side of the winding in the portion 11g of the induction coil 11 is represented by symbol "g". Likewise, the distance between the upper side and lower side of the winding in the portion 11h of the induction coil 11 is represented by symbol "h". The distance in the portion 11j of the induction coil 11 is represented by symbol "j", and the distance in the portion 11k of the induction coil 11 is represented by symbol "k". The distances between the upper side and lower side of the windings have the relationship g>h>j>k. In other words, the distance between the upper side and lower side of the windings will gradually decrease in relation to the direction in which the work piece 20 travels. As the distance between the upper side and lower side of the winding decreases, the magnetic flux density that passes therebetween will increase. Thus, the solder material on the work piece 20 may be heated to a temperature that is higher when an alternating magnetic field is generated with the work piece 20 in portion 11h of the induction coil 11, than when an alternating magnetic field is generated with the work piece 20 in portion 11g of the induction coil 11. Likewise, solder material may be heated to a higher temperature if an alternating magnetic field is generated with the work piece 20 in portion 11j of the induction coil 11. Furthermore, solder material may be heated to an even higher temperature if an alternating magnetic field is generated with the work piece 20 in portion 11k of the induction coil 11. An alternating current having the same amplitude may be made to flow through each induction coil 11g, 11h, 11j, and 11k. In other words, according to the configuration described above, solder material on the work piece 20 may be gradually heated as the work piece is conveyed from upstream to downstream along the conveying direction without controlling the amplitude of the alternating current. The foregoing is described with two dimensions, but the same description also applies with three dimensions. When three dimensions, the relationship in which the distance between the upper side and lower side of the winding is g>h>j>k amounts to a configuration in which the inner areas of the induction coil 11 in a plane parallel to the winding direction of the winding (i.e., the cross-sectional areas of the inner space that penetrates the induction coil 11) gradually decreases from upstream to downstream along the direction in which the work piece 20 is conveyed. Note that it is preferable that an alternating current may applied to the induction coil while the conveyance of the work piece 20 being temporarily stopped at each of positions of the induction coil (each position corresponds to each of portions 11g, 11h, 11j, and 11k) in which the cross-sectional area thereof differs. After heating in that portion is completed, the work piece 20 will be moved to the next portion of the induction coil by the conveyor 14.

Next, an example of a heat generator mounted on the work piece 20 will be described. A heat generator is defined as a member that is comprised of a ferromagnetic material, and heated by means of the induction heating effect. In other words, a heat generator is a member through which current will flow and generate heat when exposed to an alternating magnetic field. Note that the "heat generator" may sometimes be referred to as a "susceptor".

Figure 6:
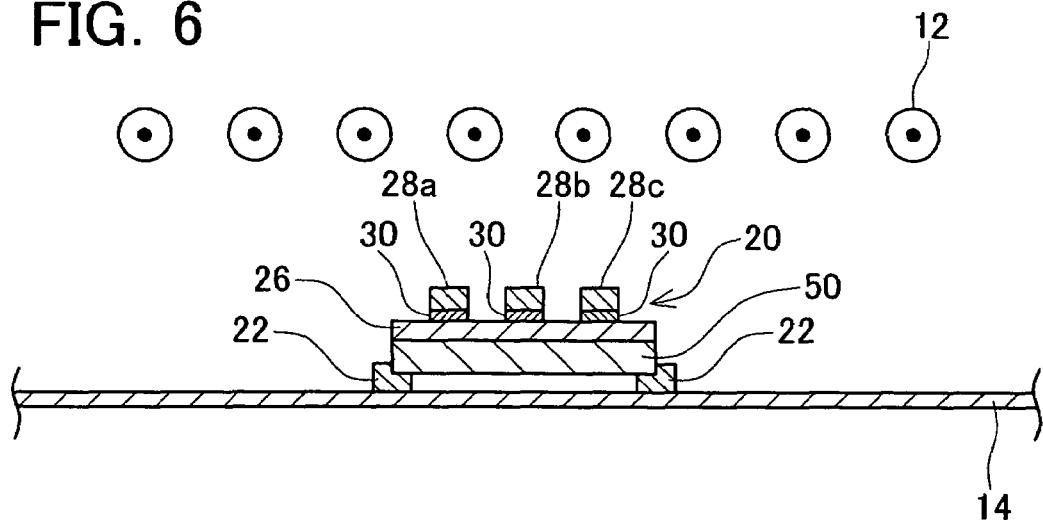
FIG. 6 is a cross-sectional view corresponding to line III-III of FIG. 1 when a heat generator is employed.
Figure 6:
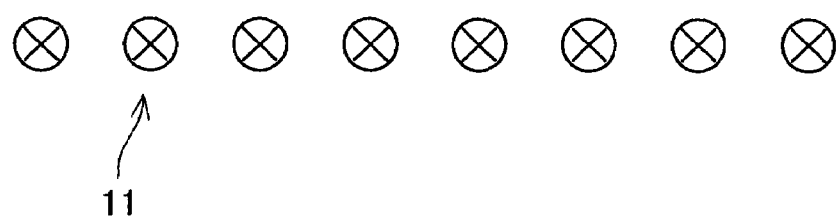

FIG. 6 is a cross-sectional view corresponding to line III-III of FIG. 1 when a work piece 20 having a heat generator mounted thereto is employed. The heat generator 50 is mounted to the lower surface of the board 26 shown in FIG. 2. In other words, the heat generator 50 is mounted on the surface of the board 26 in which circuit parts are not arranged. The heat generator 50 is mounted on the pallet 22, and the entire work piece 20 is arranged on the conveyor 14. In this case, the heat generator 50 will be uniformly heated when the heat generator mounted to the work piece 20 is positioned within the inner space of the induction coil 11 and an alternating current is made to flow through the induction coil 11 in the same way as described in FIG. 3. Heat will be evenly transmitted from the uniformly heated heat generator 50 to the board 26. Because the board 26 will be uniformly heated, each solder material 30 will also be uniformly heated, even if the solder material 30 is arranged in various positions on the board 26. As a result, the solder material 30 on the board 26 may be uniformly melted. The circuit parts 28a, 28b, 28c may be uniformly soldered to the board 26.

Note that the heat generator 50 may be removed from the board 26 at the timing that soldering is completed, or may be removed from the board 26 at the timing at which the solder material 30 has melted. If the heat generator 50 remains mounted to the board 26, even after the solder material 30 has melted, the temperature of the solder material 30 may be gradually lowered due to the heat generator 50 held at high temperature. In contrast, if the high temperature heat generator 50 is removed at the timing at which the solder material 30 has melted, the solder material may be promptly cooled. Which of these is better depends on an amount of time to cool and fix the solder material 30 properly.

Next, variations in the shape of the heat generator will be described. An example will be employed in which the proper heating time for the solder material arranged on the central region of the board 26 is longer than that for the solder material arranged on the edge regions of the board 26. In this situation, the central region of the board 26 may be heated more slowly than the edge regions thereof.

Figure 7:
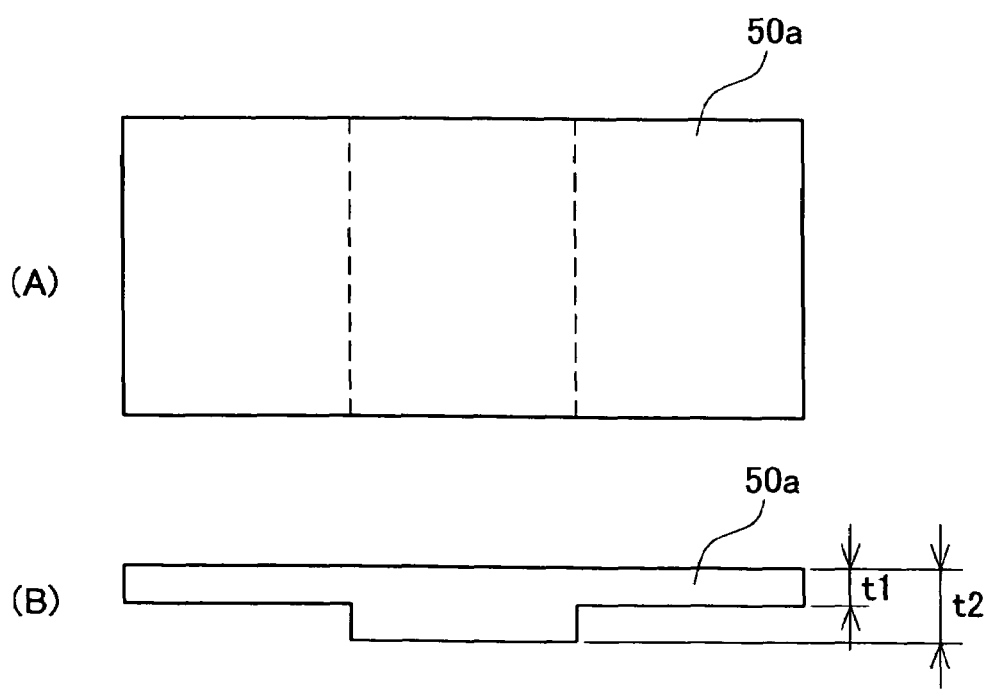
FIG. 7(A) is a plan view of an example of a heat generator.
FIG. 7(B) is a lateral view of an example of a heat generator shown in FIG. 7(A).

FIG. 7 shows the shape of a heat generator 50a that may slowly heat the central portion of the board 26. FIG. 7(A) is a plan view of the heat generator 50a, and FIG. 7(B) is a lateral view of the heat generator 50a. The upper side of the lateral view of the heat generator 50a shown in FIG. 7(B) is the surface that will be mounted to a board. The central portion of the heat generator 50a may contact with the central portion of the board 26 while the edge portions of the heat generator 50a may contact with the edge portions of the board 26. In this case, the thickness t2 of the central portion of the heat generator 50a is formed to be thicker than the thickness t1 of the edge portions of the heat generator 50a. In other words, when the heat generator 50a is mounted to a board, the thickness of the heat generator 50a at the central region of the board will be t2, and the thickness of the heat generator 50a at the edge regions of the board will be t1.

Because the heat generator 50a has larger heat capacity in the central portion of the heat generator 50a than in the edge regions thereof, the temperature at the central portion may increase more slowly than the temperature at the edge regions even if an alternating magnetic field is applied uniformly both of the central portion and edge regions of the heat generator 50a. Thus, by mounting the heat generator 50a having the shape shown in FIG. 7 to a board and performing induction heating, the central portion of the board in which solder material having a long proper heating time is arranged may be heated more slowly than the edge regions of the board. Each solder material may be heated and melted so as to match the proper heating time of each solder material. Due to the heat generator 50a, circuit parts may be uniformly and satisfactorily soldered to a board at one time, even if solder material having different proper heating times are employed on one board.

Figure 8:
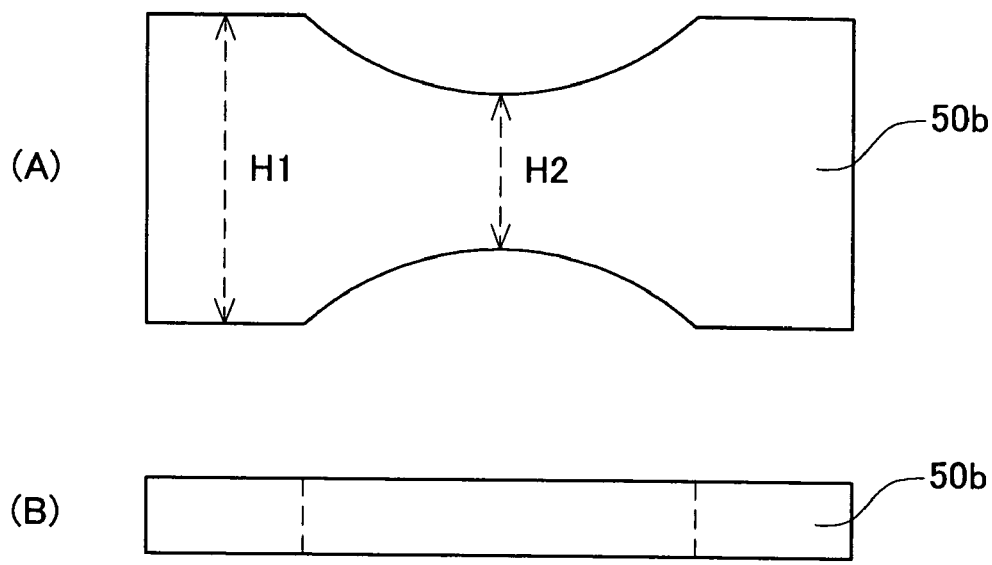
FIG. 8(A) is a plan view of another example of a heat generator.
FIG. 8(B) is a lateral view of another example of a heat generator shown in FIG. 8(A).

In addition, when solder material is not arranged on the central portion and also near the lateral side of a board, a heat generator 50b having the shape illustrated in FIG. 8 may be employed. FIG. 8(A) shows a plan view of the heat generator 50b. FIG. 8(B) shows a lateral view of the heat generator 50b. The width H2 of the central portion of the heat generator 50b is formed to be shorter than the width H1 of the edge portions thereof. In other words, the heat generator 50b has a shape that the side portions of the heat generator 50b at center along the longitudinal direction (the left and right direction in FIG. 8(A)) are cut out. The upper surface of the heat generator 50b in FIG. 8(B) is the surface that may be mounted to a board. In other words, the surface area of the heat generator 50b that faces the board will be formed to be smaller than the surface area of the board that faces the heat generator 50b. The induction heating may be performed while the heat generator 50b mounted to a board is positioned within the inner space of the induction coil, and thus, heat generator 50b is heated. The board may be heated by the heat generator 50b which is heated due to induction heating. In this case, even if the heat generator 50b may be uniformly heated, an amount of heat may not be uniformly transferred from the heat generator to the board because portions of the board corresponding to the cutout portions of the heat generator 50b may not contact with the heat generator 50b. By matching the cutout portions of the heat generator 50b with the portions of the board in which solder material are not arranged thereon, and then mounting the heat generator 50b to the board, the portions of the board on which solder material are not arranged may not be heated. Because the portions of the board in which heating is unnecessary may not be heated, an amount of heat transferred from the heat generator 50b to the board may be reduced.

When a heat generator is formed such that the width and thickness thereof are uniform, the central portion of the heat generator may be easier to heat than the edge portions thereof because an amount of heat is transferred from both of edge portions to the central portion. Accordingly, by making the width H2 of the heat generator 50b to be shorter than the width H1 of the edge portions thereof as shown in FIG. 8, an effect may be obtained in which the ability of the heat generator 50b to be uniformly heated will be maintained with greater precision.

Figure 9:
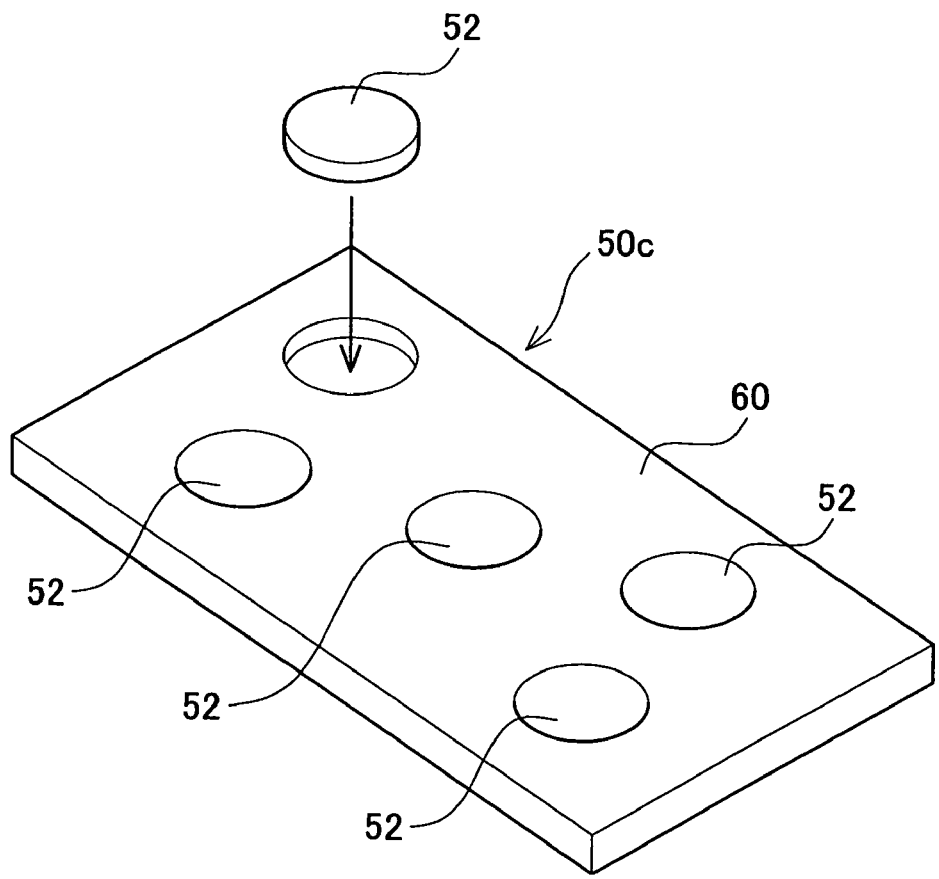
FIG. 9 is a schematic perspective view of yet another example of a heat generator.

In addition, FIG. 9 depicts a schematic perspective view of another example of the shape of a heat generator 50c. The heat generator 50c has a plurality of holes provided in a heat generator frame 60 formed with a non-magnetic material, and heat generator small pieces 52 comprised of a ferromagnetic material are press fitted into the holes. By arranging the heat generator small pieces 52 that are press fitted into the holes of the heat generator frame 60 to correspond to the portions of a board that are to be heated, an amount of heat may be transferred from the heat generator small pieces 52 that have been heated by induction heating to only the portions of a board that are to be heated.

Furthermore, it is preferred that heat generator small pieces 52 have a different thickness each other. In addition, it is also preferred that heat generator small pieces 52 are comprised of magnetic material having different magnetic characteristics each other. By making the thickness of each heat generator wafer 52 different, the heating time for each heat generator small piece 52 may be adjusted. In addition, by providing each heat generator small piece 52 with different magnetic characteristics, the temperature reached by means of the same alternating magnetic field may be made different for other heating times. By making the thickness and magnetic characteristics of the heat generator small piece 52 different in accordance with the type of solder material arranged on a board, the solder material on one board may be uniformly heated and melted, regardless of the type of solder material used. In other words, all of the parts may be uniformly and satisfactorily soldered at one time, even if the solder material employed on the board are different.

Figure 10:
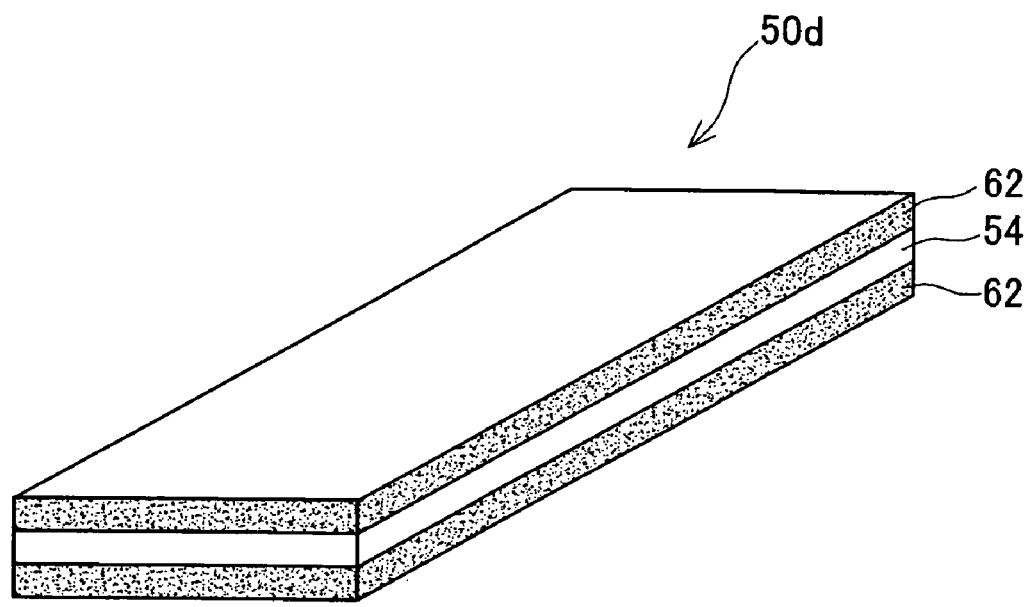
FIG. 10 is a schematic perspective view of yet another example of a heat generator.
Figure 11:
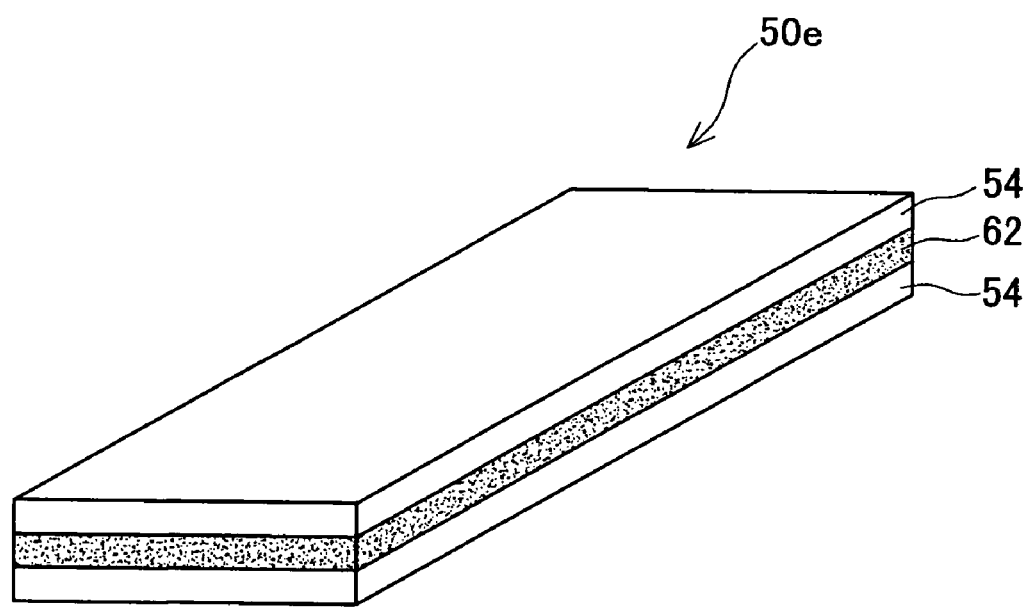
FIG. 11 is a schematic perspective view of yet another example of a heat generator.

Furthermore, examples of other heat generators are depicted in FIG. 10 and FIG. 11.

A heat generator 50d depicted in FIG. 10 has another type of metal plate 62, such as metal coated plate or the like, adhered to both surfaces of a heat generator plate 54. A heat generator 50e depicted in FIG. 11 has a heat generator plate 54 adhered to both surfaces of another type of metal plate 62. By adhering different types of metal plates together in this way, the heat generators 50d, 50e may be uniformly heated.

In addition to the heat generators described above, a heat generator that is divided to match the shape of a board or the arrangement of solder material on a board and then mounted on a board may be also desirable.

Embodiment 2

Next, a method of manufacturing a device having a board on which circuit parts are soldered will be described. In the present embodiment, the device is a circuit board having predetermined functions.

In the manufacturing process, the circuit board, such as the board 26 shown in FIG. 2, is first positioned in the central region of the cross-section of the inner space of the induction coil 11, as shown in FIGS. 1 and 2. At this point, circuit parts 28a, 28b, 28c and solid solder material 30 are mounted on the board 26. Then, an alternating current will be made to pass through the induction coil 11 by the controller 18. By making an alternating current pass through the induction coil 11, an alternating magnetic field may be generated in the induction coil 11. Due to the induction heating effect of the alternating magnetic field, the solder material 30 on the board 26 may be heated and melted. At the point at which the solder material 30 has melted, the flow of the alternating current to the induction coil 11 may be stopped. Then, the board 26 may be cooled. Note that the board 26 may be left at room temperature in order to cool. When the board 26 has cooled, and the solder material 30 has re-hardened, the circuit parts 28a, 28b, 28c may be soldered to the board 26. In this way, a device having a board on which circuit parts are uniformly soldered may be manufactured.

Note that, as shown in FIG. 6, it is desirable to add a step in which the heat generator 50 is mounted to the board 26 prior to an alternating magnetic field being generated by the induction coil 11. In addition, it is also desirable for an induction coil 1 having the shape shown in one of FIG. 4 or FIG. 5 to be employed. Furthermore, when a heat generator is employed, it is also desirable for a heat generator having the shapes shown in one of FIGS. 7 to 9 to be employed.

After solder material has been heated and melted by an alternating magnetic field generated by the induction coil 11, the heat generator 50 may be removed from the board 26 after the solder has re-hardened. In addition, the heat generator 50 may be removed from the board 26 at the timing at which the solder material has melted. If the heat generator 50 remains mounted to the board 26 and cools after the solder material 30 have melted, the temperature of the solder material 30 may be gradually reduced due to the amount of heat held in the heat generator 50. In contrast, if a high temperature heat generator 50 is removed at the timing at which the solder material 30 has melted, the solder material may be promptly cooled. Which cooling method is better may be determined in accordance with the properties of the solder material 30 to be used.

Although specific examples of the present invention were described in detail above, these are simply illustrations, and do not limit the scope of the patent claims. Various modifications and changes to the specific example illustrated above are included within the technical scope of the disclosure of the patent claims.

For example, it is preferable that solder material comprising a ferromagnetic material be employed as the solder material used in the embodiments. The solder material will be even more easily heated by means of an alternating magnetic field generated by the induction coil.

In addition, as shown in FIG. 2, the cross-section of the induction coil 11 is substantially square in the embodiments (the cross-section in the plane along the winding 12). The shape of the cross-section of the induction coil 11 may, for example, be elliptical or any other shape.

In addition, in the embodiments, a conveyor was illustrated as a positioning device that positions a board in the central region of the cross-section of the inner space. However, the positioning device may be a stand arranged inside the inner space of the induction coil. The stand may be arranged so that a board will be positioned in the central region of the cross-section of the inner space when the board is mounted on the stand.

In addition, the conveyor (positioning device) that conveys a board from outside the induction coil to the central region of the cross-section of the inner space may be a device that conveys the board while suspending it from above. In this situation as well, the positioning device is configured so that it may position a board in the inner space of an induction coil in the central region of the cross-section thereof.

The technological elements described in the present specification or drawings exhibit technological utility either alone or in various combinations, and are not to be limited to the combination of the claims disclosed at the time of application. Furthermore, the technology illustrated in the present specification, or drawings, simultaneously achieves a plurality of objects, and the achievement of even one object from amongst these has technological utility.

What is claimed is:

1. An apparatus for soldering at least one part to a board, comprising:
   a board;
   an induction coil that has an inner space penetrating the induction coil along the longitudinal direction;
   a conveyor passing through the inner space of the induction coil and disposed at an approximate central region of the inner space within a cross sectional plane of the induction coil, wherein the conveyor conveys the board supporting the part via a solder material along the longitudinal direction of the induction coil and positions the board;
   a pallet disposed on the conveyor;
   a heat generator disposed on the pallet and conveyed along the longitudinal direction of the induction coil while supporting the board from below, wherein the heat generator generates heat due to a current that flows in the heat generator when the heat generator is disposed in an alternating magnetic field; and
   a controller for applying alternating current to the induction coil, and thereby heat and melt the solder material and solder the part to the board.

2. The apparatus of claim 1, wherein the pitches of the winding of the induction coil vary along the longitudinal direction of the induction coil.

3. The apparatus of claim 1, wherein the cross sectional areas of the induction coil vary along the longitudinal direction.

4. The apparatus of claim 1, wherein the cross sectional areas of the induction coil gradually decrease from upstream to downstream along the conveying direction of the conveyor.

5. The apparatus of claim 1, wherein the thickness of the heat generator along a direction perpendicular to a contact surface between the heat generator and the board varies in an area of the contact surface.

6. The apparatus of claim 1, wherein the heat generator has a contact portion that contacts with the board and a non-contact portion that does not contact with the board.

7. The apparatus of claim 1, wherein:
   a frame of the heat generator is made of nonmagnetic material and has holes at positions corresponding to portions to be heated of the board, and
   a heat generator fragment made of magnetic material is fitted into each of the holes.

8. The apparatus of claim 1, wherein the heat generator comprises:
   a heat generator plate; and
   another type of metal plates attached on both sides of the heat generator plate.

9. A method of soldering at least one part to a board, the method being performed by a soldering apparatus, wherein the soldering apparatus comprising:
   providing a board;
   an induction coil that has an inner space penetrating the induction coil along the longitudinal direction;

a conveyor passing through the inner space of the induction coil and disposed at an approximate central region of the inner space within a cross sectional plane of the induction coil, wherein the conveyor conveys the board supporting the part via a solder material along the longitudinal direction of the induction coil and positions the board;

a pallet disposed on the conveyor;

a heat generator disposed on the pallet and conveyed along the longitudinal direction of the induction coil while supporting the board from below, wherein the heat generator generates heat due to a current that flows in the heat generator when the heat generator is disposed in an alternating magnetic field; and a controller for applying alternating current to the induction coil, and the method comprising:

disposing on the conveyor the board that supports the part via a solder material, wherein the board is supported by the heat generator from below;

positioning the board and the heat generator by conveying the board and the heat generator inside the inner space of the induction coil by the conveyor;

applying an alternating current to the induction coil by the controller; and generating heat by the heat generator by the alternating magnetic field generated by the applied alternating current, and heating the board by the heat generated by the heat generator, and thereby heat and melt the solder material and solder the part to the board.

10. An apparatus for soldering at least one part to a board, comprising:

a board;

an induction coil that forms a shape of a substantial rectangle at a cross sectional plane of the induction coil and has an inner space penetrating the induction coil along the longitudinal direction;

a heat generator to be attached to the board and generating heat due to an alternating magnetic field, a conveyor that conveys the heat generator attached to the board supporting the part via a solder material and positions the heat generator in the inner space at an approximate central region of the rectangle within the cross sectional plane of the induction coil;

a pallet disposed on the conveyor and adapted to receive the heat generator; and a controller for applying alternating current to the induction coil, and thereby heats and melts the solder material and solders the part to the board;

wherein the conveyor positions the heat generator so that a surface of the heat generator is parallel to one side of the rectangle and is parallel to direction of the magnetic flux caused by the induction coil.

* * * * *

UNITED STATES PATENT AND TRADEMARK OFFICE
CERTIFICATE OF CORRECTION

PATENT NO.       : 7,649,159 B2                                                Page 1 of 1
APPLICATION NO.  : 11/486084
DATED            : January 19, 2010
INVENTOR(S)      : Matsuura et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 438 days.

Signed and Sealed this

Twenty-third Day of November, 2010

David J. Kappos
*Director of the United States Patent and Trademark Office*